US012685212B2

(12) United States Patent
Kawase et al.

(10) Patent No.: US 12,685,212 B2
(45) Date of Patent: Jul. 14, 2026

(54) SWITCHING DEVICE ELECTRICALLY CONNECTED TO A LEAD FRAME BY A BONDING MATERIAL

(71) Applicant: Mitsubishi Electric Corporation, Tokyo (JP)

(72) Inventors: Tatsuya Kawase, Tokyo (JP); Naoki Yoshimatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 295 days.

(21) Appl. No.: 18/334,304

(22) Filed: Jun. 13, 2023

(65) Prior Publication Data

US 2024/0120307 A1 Apr. 11, 2024

(30) Foreign Application Priority Data

Oct. 5, 2022 (JP) ................................. 2022-160807

(51) Int. Cl.
 *H10W 74/10* (2026.01)
 *H10W 70/40* (2026.01)
 (Continued)

(52) U.S. Cl.
 CPC ....... *H10W 74/127* (2026.01); *H10W 70/457* (2026.01); *H10W 70/481* (2026.01);
 (Continued)

(58) Field of Classification Search
 CPC ....... H01L 24/32; H01L 24/33; H01L 25/072; H01L 2924/181; H01L 2924/13055;
 (Continued)

(56) References Cited

U.S. PATENT DOCUMENTS 11,742,268 B2 * 8/2023 Fang ................. H01L 23/49562
 438/123
11,776,929 B2 * 10/2023 Umeda ................... H01L 24/32
 257/666

(Continued)

FOREIGN PATENT DOCUMENTS

DE 10 2022 126 046 A1 4/2023
DE 11 2021 007 373 T5 2/2024

(Continued)

OTHER PUBLICATIONS

"Notice of Reasons for Refusal" Office Action issued in JP 2022-160807; mailed by the Japanese Patent Office on Jan. 6, 2026.

(Continued)

*Primary Examiner* — Alonzo Chambliss
(74) *Attorney, Agent, or Firm* — Studebaker Brackett PLLC

(57) ABSTRACT

Provided is a semiconductor device reducing local increase in temperature caused by a void in a bonding material. A semiconductor device includes a conductive member, a semiconductor element, a bonding part, and a lead. The semiconductor element includes a switching element. The semiconductor element is held by the conductive member via a first bonding material. The bonding part is provided on an upper surface of the semiconductor element. The bonding part is electrically connected to an electrode of the switching element other than a gate electrode. The lead is bonded to the bonding part via a second bonding material. The bonding part and the second bonding material are provided in a region including a center part of the upper surface of the semiconductor element.

15 Claims, 16 Drawing Sheets

(51) Int. Cl.

| | | |
|---|---|---|
| *H10W 72/00* | (2026.01) | |
| *H10W 90/00* | (2026.01) | |
| *H10W 72/30* | (2026.01) | |

(52) U.S. Cl.

CPC ......... *H10W 90/00* (2026.01); *H10W 90/731* (2026.01); *H10W 72/07352* (2026.01); *H10W 72/328* (2026.01); *H10W 90/736* (2026.01)

(58) Field of Classification Search

CPC ..... H01L 2924/13091; H01L 23/49562; H01L 23/3142; H01L 23/49844; H01L 23/3107; H01L 23/49811; H10W 74/127; H10W 90/00; H10W 70/481; H10W 70/457; H10W 90/731

See application file for complete search history.

(56) References Cited

U.S. PATENT DOCUMENTS

| | | | |
|---|---|---|---|
| 2013/0241043 A1 * | 9/2013 | Kato ................... | H01L 23/4334 |
| | | | 257/715 |
| 2014/0103510 A1 * | 4/2014 | Andou .............. | H01L 23/49551 |
| | | | 257/676 |
| 2014/0110752 A1 | 4/2014 | Fujino et al. | |
| 2021/0193292 A1 | 6/2021 | Martin | |
| 2022/0020869 A1 | 1/2022 | Ishii | |
| 2022/0028761 A1 * | 1/2022 | Yamada ................... | H01L 24/32 |
| 2023/0130373 A1 | 4/2023 | Nishiyama et al. | |
| 2023/0154820 A1 * | 5/2023 | Yamane ................. | H01L 24/48 |
| | | | 257/707 |
| 2024/0063073 A1 | 2/2024 | Yoshimatsu et al. | |

FOREIGN PATENT DOCUMENTS

| | | | |
|---|---|---|---|
| JP | 2006-156479 | A | 6/2006 |
| JP | 2015-115471 | A | 6/2015 |
| JP | 2022-018559 | A | 1/2022 |
| WO | 2013/002338 | A1 | 1/2013 |
| WO | 2020/054688 | A1 | 3/2020 |
| WO | 2021/095323 | A1 | 5/2021 |

OTHER PUBLICATIONS

An Office Action issued by the German Patent and Trademark Office on Oct. 9, 2025, which corresponds to German Patent Application No. 102023120097.6 and is related to U.S. Appl. No. 18/334,304; with English language translation.

"Summons to attend oral proceedings" issued by the German Patent and Trademark Office on Feb. 16, 2026, which corresponds to German Patent Application No. 10 2023 120 097.6 and is related to U.S. Appl. No. 18/334,304; with English language translation.

"Decision of Refusal" Office Action issued in JP 2022-160807; mailed by the Japanese Patent Office on May 19, 2026.

\* cited by examiner

F I G. 1
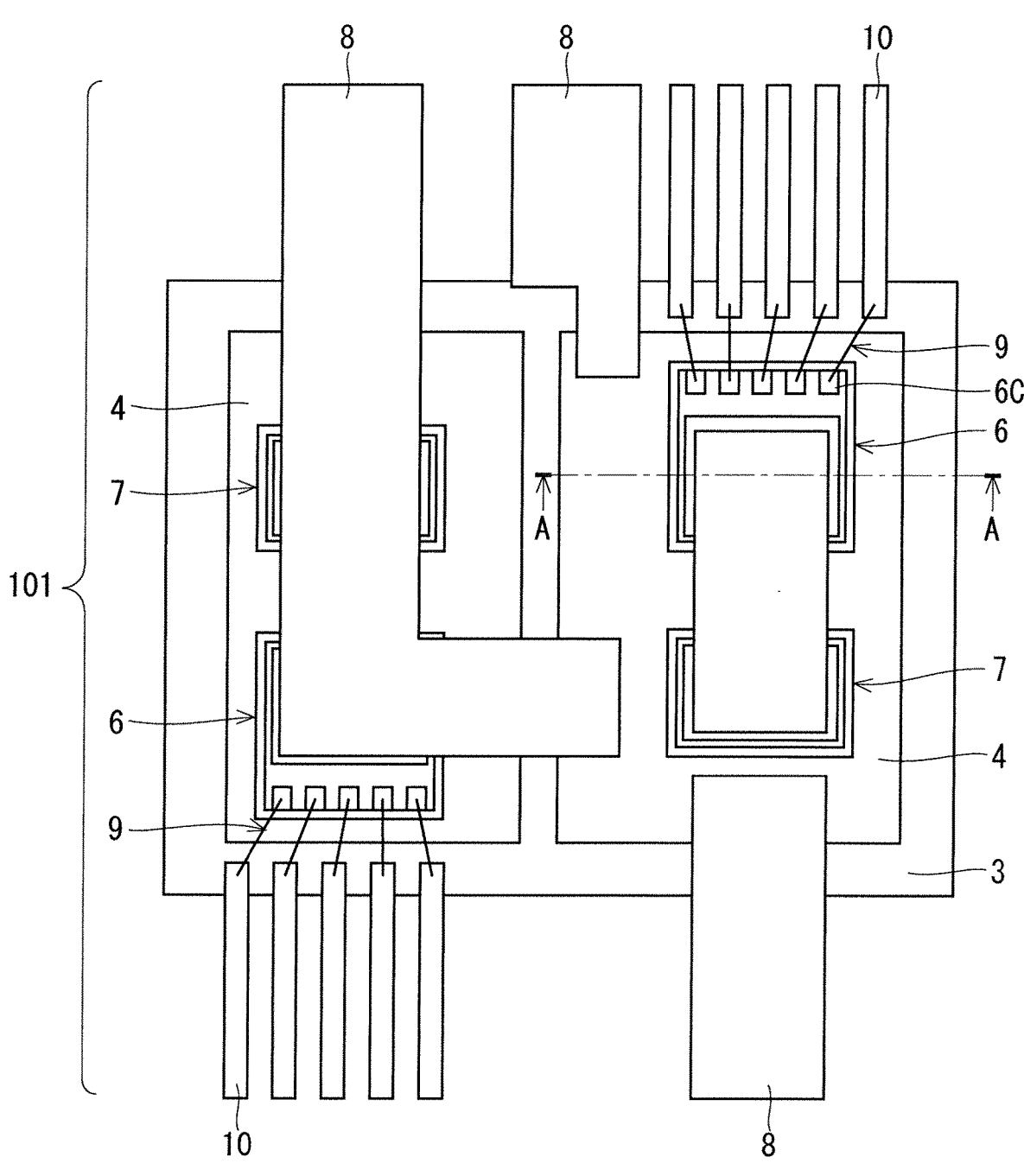

F I G.  2
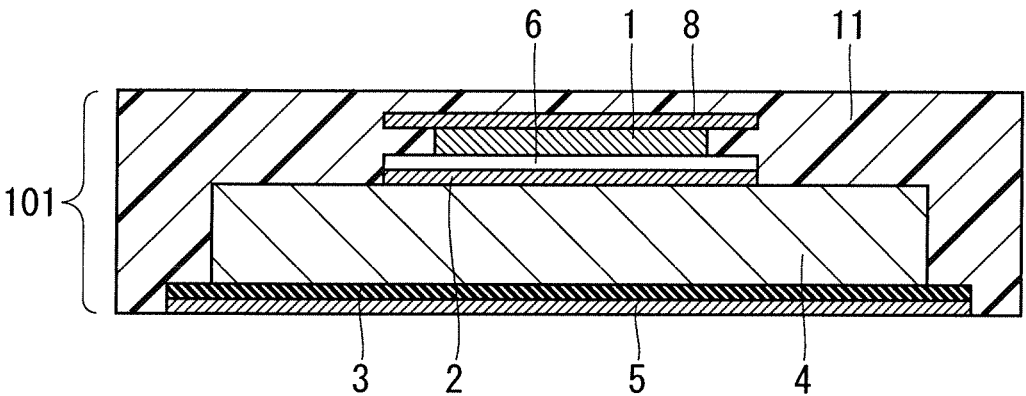

F I G. 3
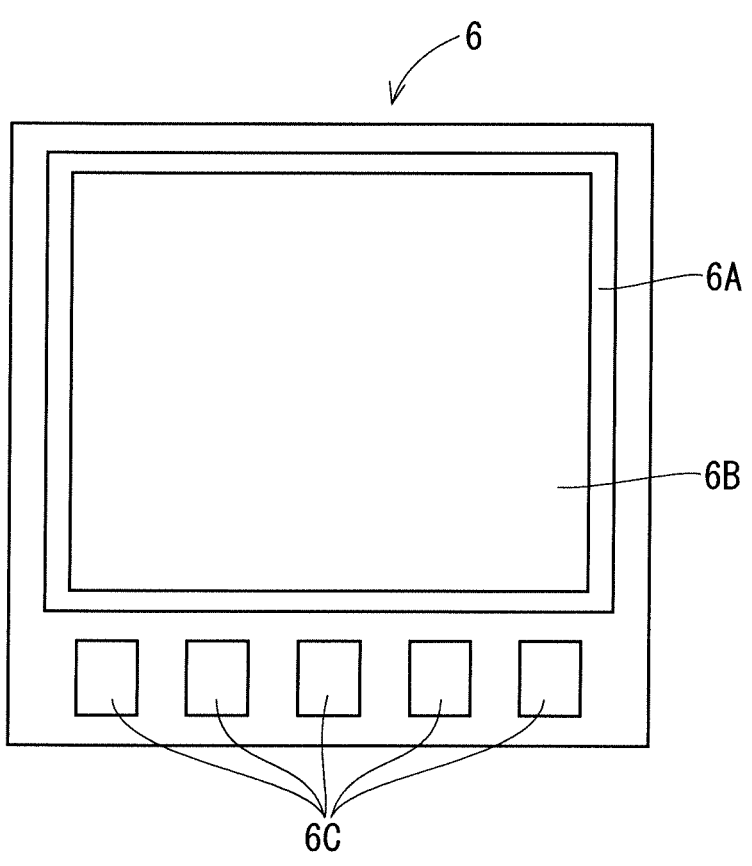

F I G. 4
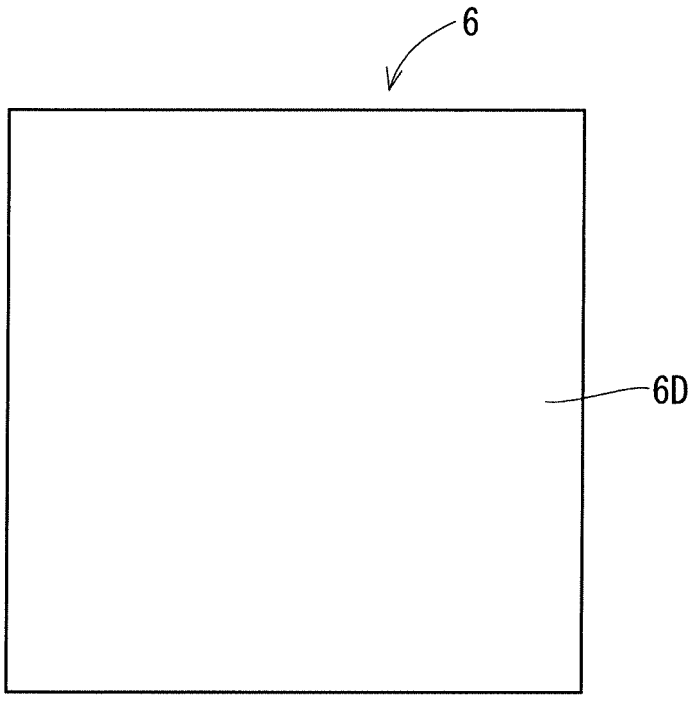

F I G. 5
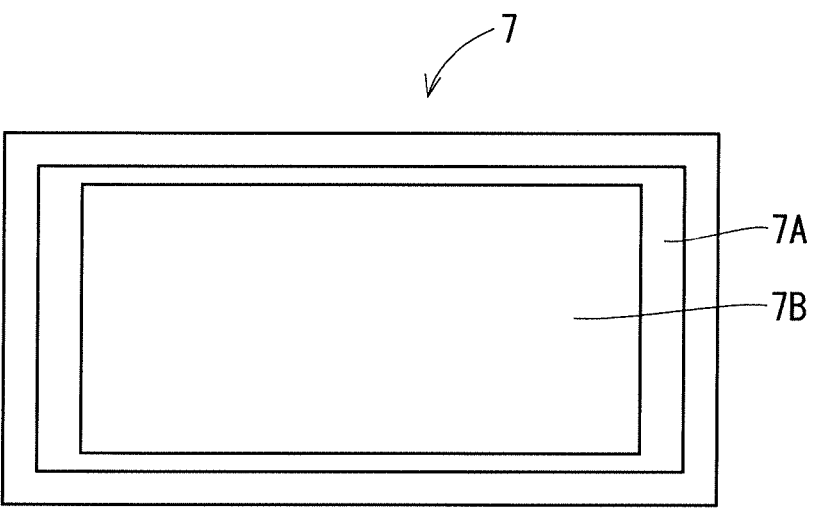

F I G. 6
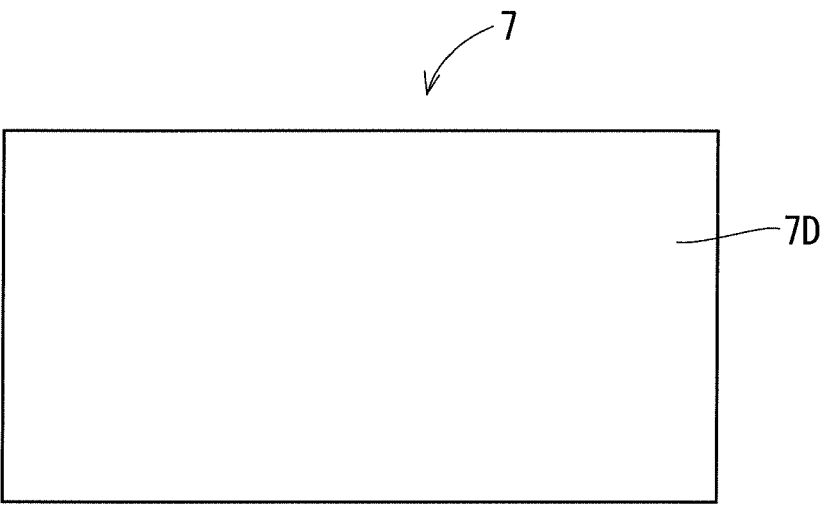

F I G.  7
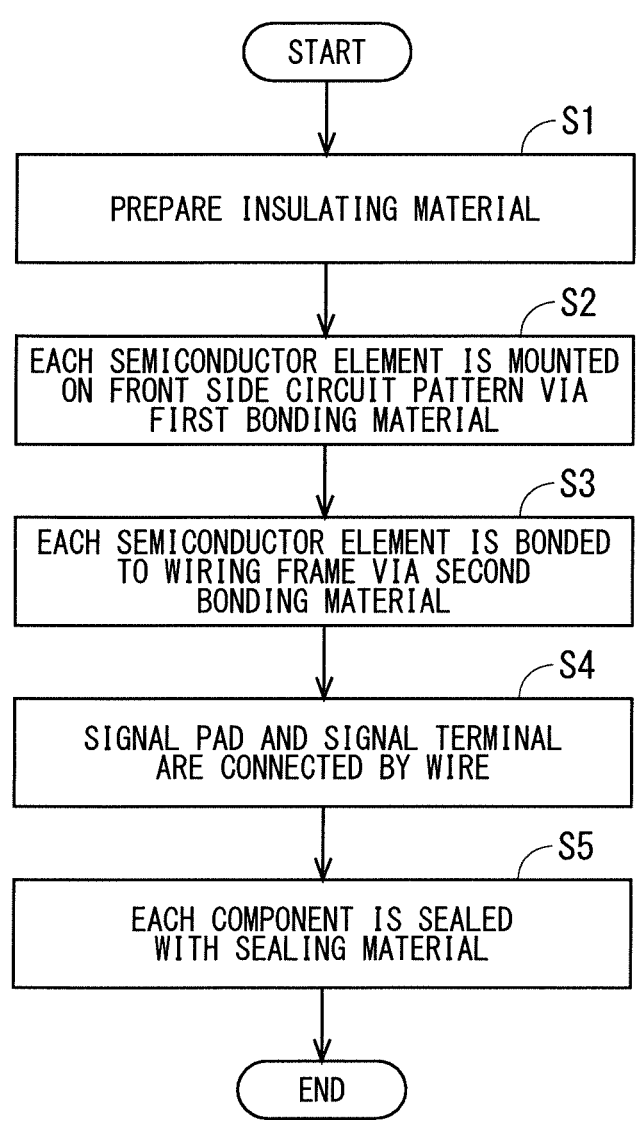
START
S1
PREPARE INSULATING MATERIAL
S2
EACH SEMICONDUCTOR ELEMENT IS MOUNTED
ON FRONT SIDE CIRCUIT PATTERN VIA
FIRST BONDING MATERIAL
S3
EACH SEMICONDUCTOR ELEMENT IS BONDED
TO WIRING FRAME VIA SECOND
BONDING MATERIAL
S4
SIGNAL PAD AND SIGNAL TERMINAL
ARE CONNECTED BY WIRE
S5
EACH COMPONENT IS SEALED
WITH SEALING MATERIAL
END F I G.  8
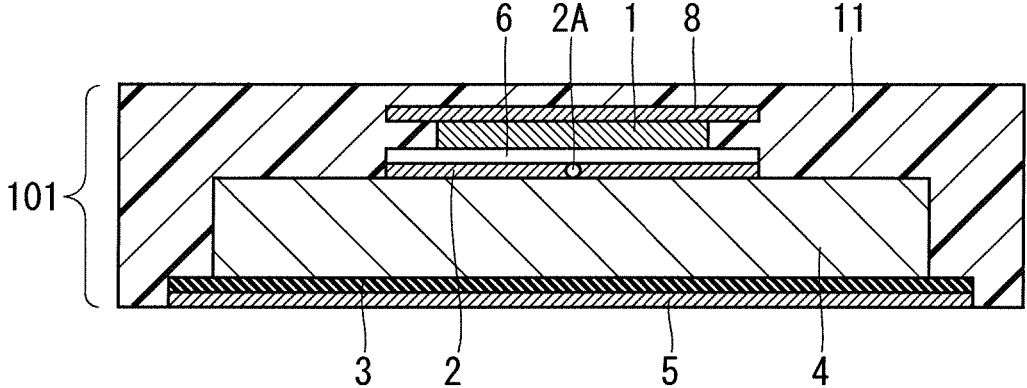

F I G. 9
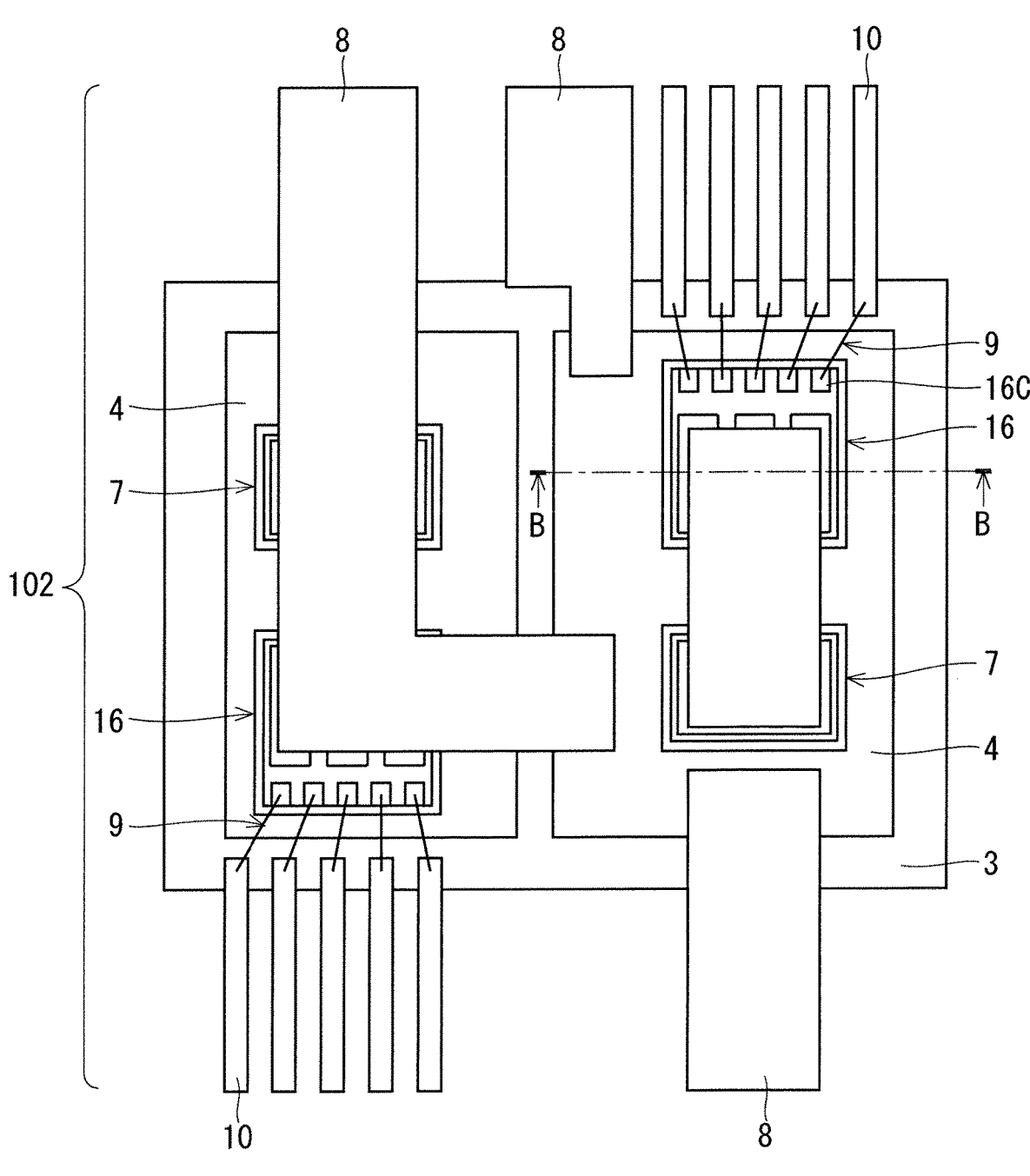

F I G .  1 0
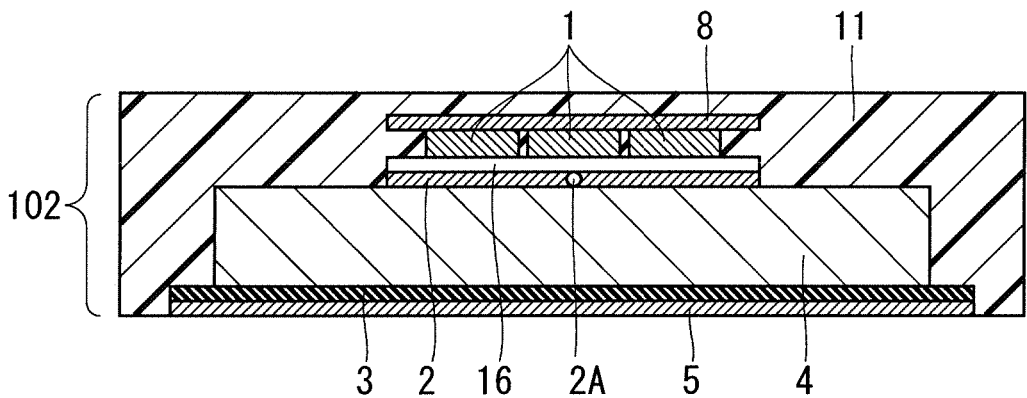

F I G.  1 1
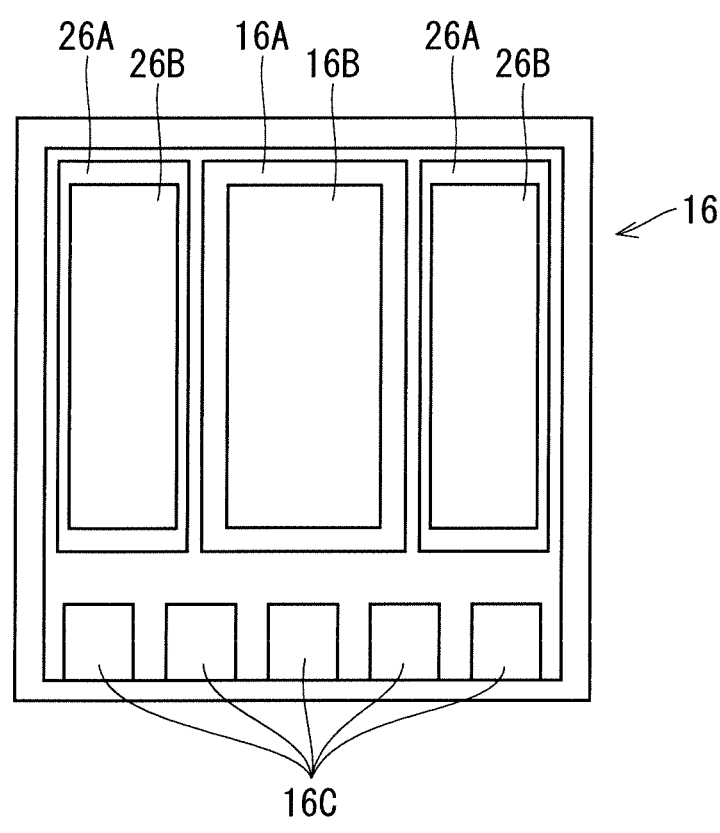

F I G .   1 2
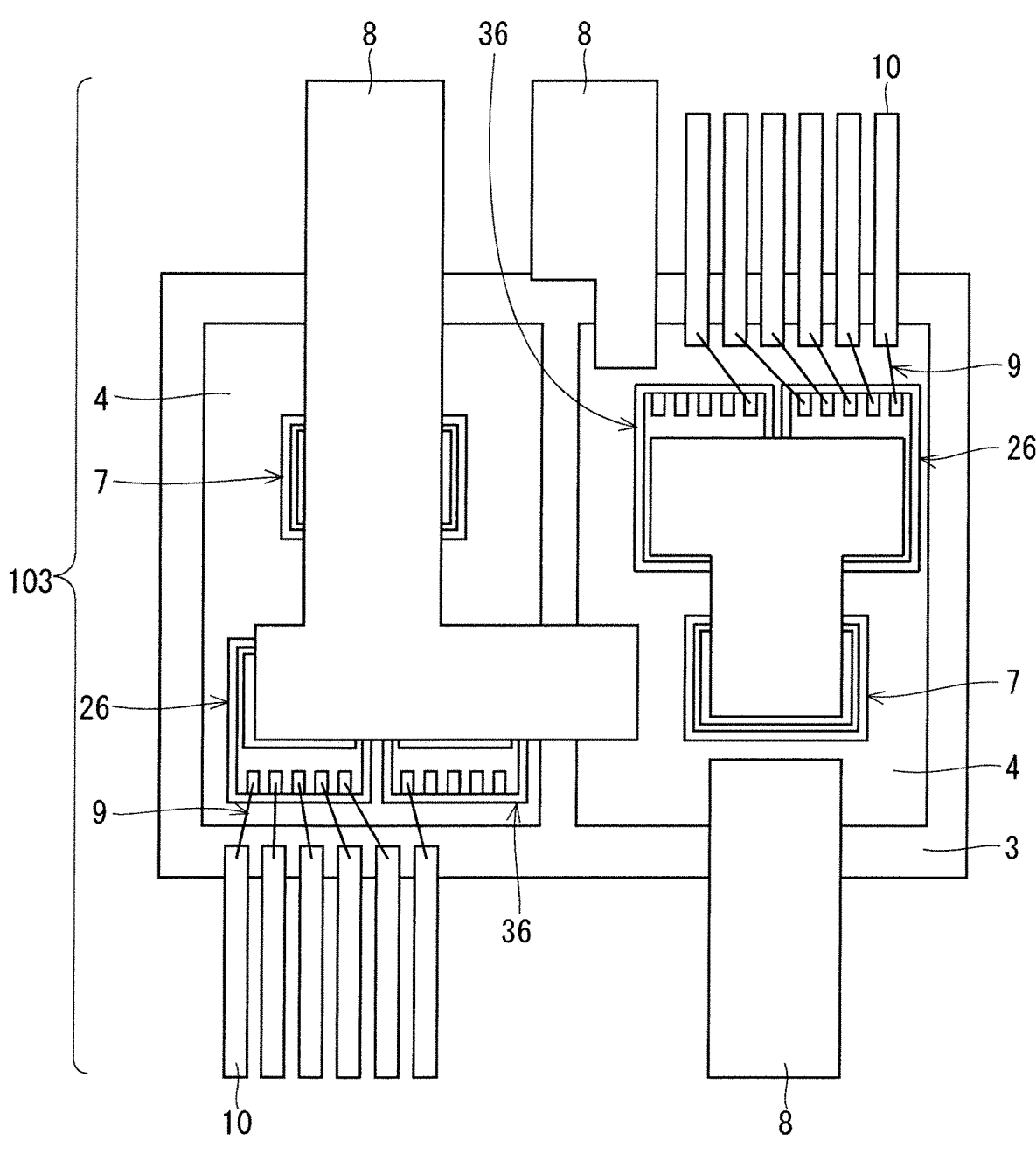

F I G 1 4
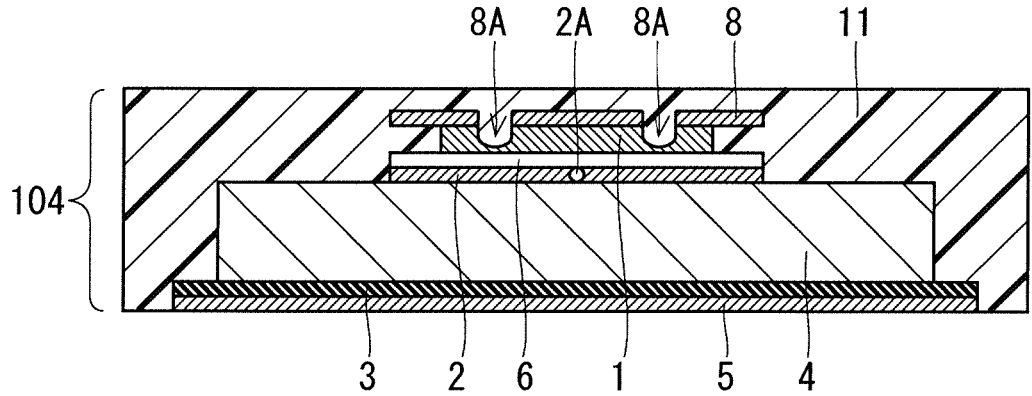

F I G.   1 5
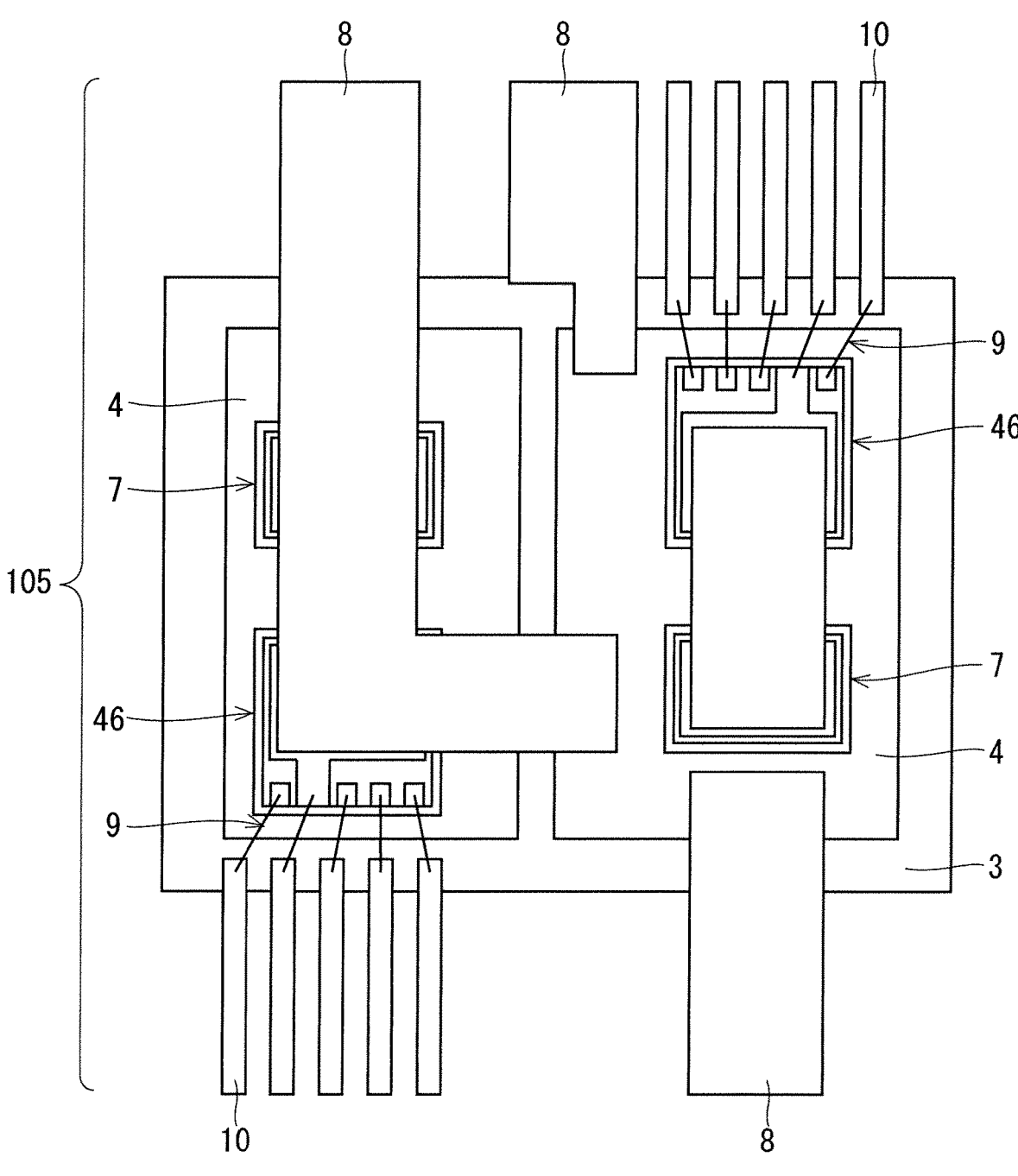

F I G.  1 6
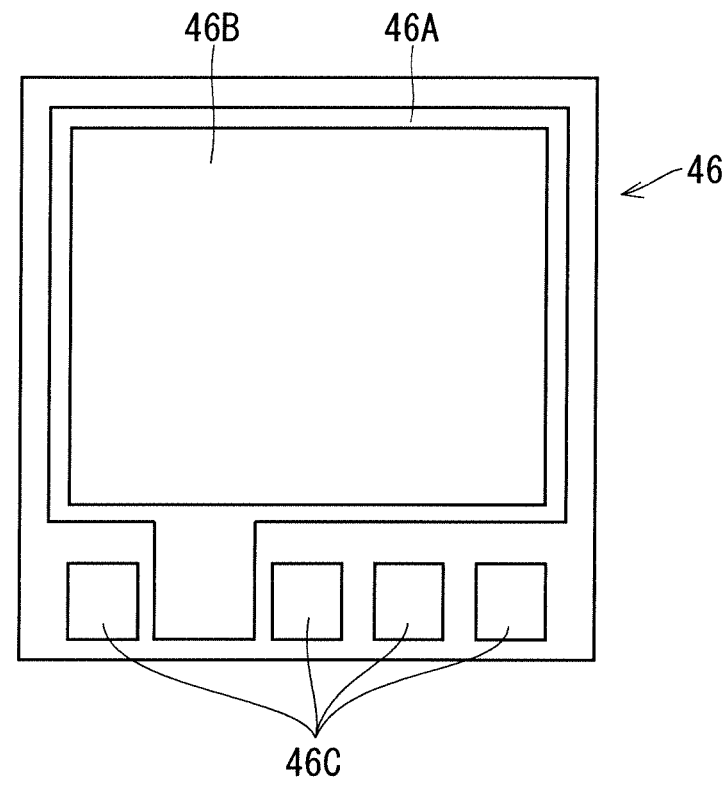

SWITCHING DEVICE ELECTRICALLY CONNECTED TO A LEAD FRAME BY A BONDING MATERIAL

BACKGROUND OF THE INVENTION

Field of the Invention

The present disclosure relates to a semiconductor device.

Description of the Background Art

International Publication number 2021/095323 describes a semiconductor device in which a back surface of a switching element is bonded to a metal member and a front surface of the switching element is bonded to an intermediate terminal. The semiconductor device wired by the intermediate terminal made up of plate-like metal is excellent in current capacitance characteristics while achieving a small area. Thus, the semiconductor device having such a configuration is widely used for various power control apparatuses such as a control device of air-conditioning equipment.

SUMMARY

A semiconductor element such as a switching element and a metal member are fixed to each other by a bonding material. When the semiconductor element is bonded to the metal member, a void occurs in the bonding material with a fixed probability. When the bonding material includes the void, cooling of the semiconductor element immediately above the void is prevented, and a temperature of the semiconductor element locally increases.

The present disclosure provides a semiconductor device reducing local increase in temperature caused by a void in a bonding material.

A semiconductor device according to the present disclosure includes a conductive member, a semiconductor element, a bonding part, and a lead. The semiconductor element includes a switching element. The semiconductor element is held by the conductive member via a first bonding material. The bonding part is provided on an upper surface of the semiconductor element. The bonding part is electrically connected to an electrode of the switching element other than a gate electrode. The lead is bonded to the bonding part via a second bonding material. The bonding part and the second bonding material are provided in a region including a center part of the upper surface of the semiconductor element.

Provided is a semiconductor device reducing local increase in temperature caused by a void in a bonding material.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating a configuration of a semiconductor device according to an embodiment 1.

FIG. 2 is a cross-sectional view illustrating a configuration of the semiconductor device according to the embodiment 1.

FIG. 3 is a plan view illustrating a configuration of an upper surface of a switching semiconductor element according to the embodiment 1.

FIG. 4 is a bottom view illustrating a configuration of a lower surface of the switching semiconductor element according to the embodiment 1.

FIG. 5 is a plan view illustrating a configuration of an upper surface of a reflux semiconductor element according to the embodiment 1.

FIG. 6 is a bottom view illustrating a configuration of a lower surface of the reflux semiconductor element according to the embodiment 1.

FIG. 7 is a flow chart illustrating a method of manufacturing a semiconductor device.

FIG. 8 is a cross-sectional view illustrating a configuration of the semiconductor device according to the embodiment 1 after completion.

FIG. 9 is a plan view illustrating a configuration of a semiconductor device according to an embodiment 2.

FIG. 10 is a cross-sectional view illustrating a configuration of the semiconductor device according to the embodiment 2.

FIG. 11 is a plan view illustrating a configuration of an upper surface of a switching semiconductor element according to the embodiment 2.

FIG. 12 is a plan view illustrating a configuration of a semiconductor device according to an embodiment 3.

FIG. 14 is a cross-sectional view illustrating a configuration of the semiconductor device according to the embodiment 4.

FIG. 15 is a plan view illustrating a configuration of a semiconductor device according to an embodiment 5.

FIG. 16 is a plan view illustrating a configuration of an upper surface of a switching semiconductor element according to the embodiment 5.

DESCRIPTION OF THE PREFERRED EMBODIMENTS

Embodiment 1

Figure 13:
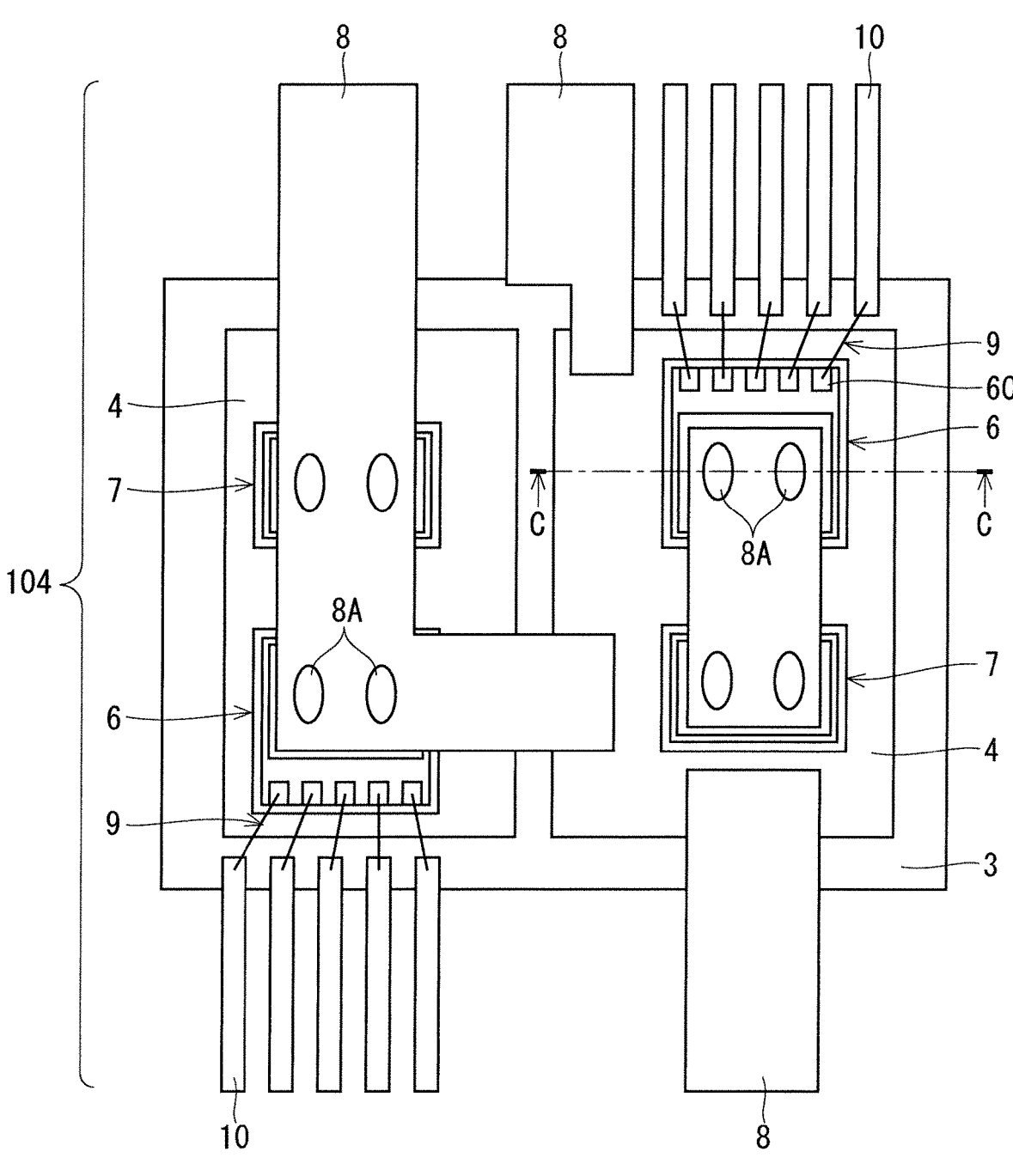
FIG. 13 is a plan view illustrating a configuration of a semiconductor device according to an embodiment 4.

FIG. 1 is a plan view illustrating a configuration of a semiconductor device 101 according to an embodiment 1. FIG. 2 is a cross-sectional view illustrating a configuration of the semiconductor device 101 according to the embodiment 1. FIG. 2 corresponds to a cross section along a line A-A illustrated in FIG. 1.

The semiconductor device 101 includes an insulating material 3, a front side circuit pattern 4, a back side circuit pattern 5, a first bonding material 2, a switching semiconductor element 6, a reflux semiconductor element 7, a second bonding material 1, a wiring frame 8, a signal terminal 10, a wire 9, and a sealing material 11. In FIG. 1, illustration of the sealing material 11 is omitted to easily understand an inner structure of the semiconductor device 101.

The insulating material 3 is formed of resin or ceramic. The insulating resin mainly contains epoxy resin, for example. Ceramic contains $Al_2O_3$, $Si_3N_4$, or AlN, for example, as a main component. From a viewpoint of heat radiation properties, it is preferable that the insulating material 3 is formed of a material having a high thermal conductivity, and is a thin member. In the meanwhile, a thickness of the insulating material 3 is preferably equal to or larger than 100 μm in consideration of securement of insulation properties and structural strength in a manufacturing process.

The front side circuit pattern 4 is provided on a front surface of the insulating material 3. The front side circuit pattern 4 is a conductive member, and is formed of metal such as aluminum, aluminum alloy, copper, or copper alloy. The front side circuit pattern 4 holds the switching semiconductor element 6 and the reflux semiconductor element 7 via the first bonding material 2. The front side circuit pattern 4 has not only a function of an electrical circuit but also a function of diffusing heat generated in the switching semiconductor element 6 and the reflux semiconductor element 7. The front side circuit pattern 4 has a thickness large enough to be able to diffuse heat sufficiently in a planar direction. Although depending on a layout in the planar direction, the thickness of the front side circuit pattern 4 is preferably equal to or larger than 0.4 mm. The front side circuit pattern 4 preferably includes a concave-convex portion such as a dimple or a slit as necessary to increase adhesiveness with the sealing material 11.

The back side circuit pattern 5 is provided on a back surface of the insulating material 3. The back side circuit pattern 5 is formed of metal such as aluminum, aluminum alloy, copper, or copper alloy.

The first bonding material 2 bonds the front side circuit pattern 4 and a lower surface of the switching semiconductor element 6. The first bonding material 2 bonds the front side circuit pattern 4 and a lower surface of the reflux semiconductor element 7. The first bonding material 2 is a lead-free solder containing Sn as a main component, for example. The first bonding material 2 may be a sintered material containing Ag or Cu as a main component.

The switching semiconductor element 6 is held by the front side circuit pattern 4 via the first bonding material 2. The switching semiconductor element 6 includes a switching element (not shown). The switching element is an insulated gate bipolar transistor (IGBT) or a metal oxide semiconductor field effect transistor (MOSFET), for example. The switching semiconductor element 6 is formed of a semiconductor such as Si or a so-called wide bandgap semiconductor such as SiC, GaN, gallium oxide, or diamond, for example.

The reflux semiconductor element 7 is held by the front side circuit pattern 4 via the first bonding material 2. The reflux semiconductor element 7 includes a diode element. The diode element may be a Schottky barrier diode (SBD) or a rectifier diode having a PN junction. The reflux semiconductor element 7 is formed of a semiconductor such as Si or a so-called wide bandgap semiconductor such as SiC, GaN, gallium oxide, or diamond, for example.

The wiring frame 8 is a lead, and is a wiring in which main current flows in the semiconductor device 101. The wiring frame 8 is bonded to the switching semiconductor element 6 and the reflux semiconductor element 7 via the second bonding material 1. A part of the wiring frame 8 functions as a main terminal (not shown) which can be connected to a circuit provided in an outer portion of the semiconductor device 101. The wiring frame 8 according to the embodiment 1 is a member made of a metal plate or a processed metal plate. The wiring frame 8 is formed of metal such as aluminum, aluminum alloy, copper, or copper alloy. A thickness of the wiring frame 8 depends on specification current or a width of a main terminal of the semiconductor device 101. The thickness of the wiring frame 8 is preferably equal to or larger than 0.5 mm and equal to or smaller than 2.0 mm to suppress self-heat generation of the main terminal at a time of applying current. A metal wire may be used as a lead in place of the wiring frame 8.

The second bonding material 1 bonds the switching semiconductor element 6 and the wiring frame 8. The second bonding material 1 bonds the reflux semiconductor element 7 and the wiring frame 8. The second bonding material 1 is a lead-free solder containing Sn as a main component, for example. The second bonding material 1 may be a sintered material containing Ag or Cu as a main component.

One end of the signal terminal 10 functions as a terminal which can be connected to a circuit provided in an outer portion of the semiconductor device 101. The signal terminal 10 is formed of copper or copper alloy, for example. The signal terminal 10 may also be formed of aluminum or aluminum alloy to reduce a weight thereof. A thickness of the signal terminal 10 is equal to or larger than 0.2 mm and equal to or smaller than 1.0 mm.

The wire 9 connects each of five signal pads 6C provided to the upper surface of the switching semiconductor element 6 and the signal terminal 10. A detailed configuration of the signal pad 6C is described hereinafter. The wire 9 is formed of aluminum, aluminum alloy, copper, or copper alloy, for example. A diameter of the wire 9 is equal to or larger than 100 μm and equal to or smaller than 400 μm.

The sealing material 11 seals the insulating material 3, the front side circuit pattern 4, the first bonding material 2, the switching semiconductor element 6, the reflux semiconductor element 7, the second bonding material 1, a part of the wiring frame 8, the wire 9, and a part of the signal terminal 10. The main terminal of the wiring frame 8, one end of the signal terminal 10, and the back side circuit pattern 5 are exposed from the sealing material 11. The sealing material 11 is formed of epoxy resin, for example. A linear expansion coefficient of the sealing material 11 is preferably equal to or larger than 18 ppm/° C. and equal to or smaller than 24 ppm/° C. Accordingly, detachment of the sealing material 11 from the front side circuit pattern 4 is suppressed, and occurrence of crack in the first bonding material 2 is prevented. Heat is generated in the switching semiconductor element 6 when the switching semiconductor element 6 is driven, thus a temperature of the sealing material 11 also increases. A glass transition temperature Tg is preferably equal to or larger than 175° C. so that the linear expansion coefficient of the sealing material 11 is not fluctuated by the increase in the temperature.

FIG. 3 is a plan view illustrating a configuration of the upper surface of the switching semiconductor element 6 according to the embodiment 1. FIG. 4 is a bottom view illustrating a configuration of the lower surface of the switching semiconductor element 6 according to the embodiment 1.

The switching semiconductor element 6 includes an element fox part 6A, a bonding part 6B, the five signal pads 6C, and a plurality of gate lines (not shown) on the upper surface thereof. The switching semiconductor element 6 includes a bonding part 6D on the lower surface thereof.

The element formation part 6A corresponds to a region where the switching element is formed in a plan view. The region includes a center part (not shown) of the upper surface of the switching semiconductor element 6. The center part includes a center of the upper surface thereof. A plurality of switching elements each including a channel are formed in the element formation part 6A according to the embodiment 1.

The bonding part 6B is provided in a region including the center part of the upper surface of the switching semiconductor element 6. For example, the bonding part 6B is provided in a region including the center of the switching semiconductor element 6 in a plan view. The bonding part 6B is bonded to the wiring frame 8 by the second bonding material 1. The second bonding material 1 is also provided in a region including the center part in a plan view.

The bonding part 6B is provided on an inner side of the element formation part 6A, however, a dimensional relationship between the bonding part 6B and the element formation part 6A is not limited thereto. A size of the bonding part 6B may be the same as that of the element formation part 6A. The bonding part 6B is formed of a metal film having fine wettability such as Ni, Au, Cu, or Ag. The bonding part 6B is electrically connected to an electrode of the switching element other than a gate electrode. When the switching element is an IGBT, the bonding part 6B is electrically connected to an emitter electrode, for example. That is to say, the bonding part 6B itself functions as an emitter electrode.

Five signal pads 6C are provided to the upper surface of the switching semiconductor element 6. Each signal pad 6C is provided in a region in the upper surface of the switching semiconductor element 6 other than the element formation part 6A. Five signal pads 6C according to the embodiment 1 are arranged in a row along one side of an outline of the switching semiconductor element 6 in a plan view. Each signal pad 6C is formed of a metal film. Each signal pad 6C is a pad for transmitting or receiving a signal for controlling or protecting the switching element. The signal is a gate signal (G), an emitter signal (E), a current sense signal (Cs), and a temperature sense signal (K, A), for example. In other words, one of five signal pads 6C is a gate pad. The gate pad is electrically connected to a gate electrode of each switching element via a plurality of gate lines (not shown). The number of the signal pads 6C is not limited to five. Thus, four or less or six or more is also applicable.

The plurality of gate lines are provided to pass across the upper surface of the switching semiconductor element 6. Each gate line is provided not to pass through the center part of the switching semiconductor element 6. The gate line is provided not to pass through the center of the switching semiconductor element 6, for example. Each gate line is electrically connected to the gate electrode of each switching element.

The bonding part 6D is provided on the lower surface of the switching semiconductor element 6. The bonding part 6D according to the embodiment 1 is provided to the whole lower surface of the switching semiconductor element 6. The bonding part 6D is formed of a metal film having fine wettability such as Ni, Au, Cu, or Ag. The bonding part 6D is electrically connected to an electrode, which is not connected to the bonding part 6B, of the switching element other than a gate electrode. When the switching element is an IGBT, the bonding part 6D is electrically connected to a collector electrode, for example. That is to say, the bonding part 6D itself functions as a collector electrode. The bonding part 6D is bonded to the front side circuit pattern 4 by the first bonding material 2.

When the switching element is an IGBT, main current corresponding to a gate signal applied to the gate electrode flows between the collector electrode formed in the bonding part 6D and the emitter electrode formed in the bonding part 6B.

FIG. 5 is a plan view illustrating a configuration of an upper surface of the reflux semiconductor element 7 according to the embodiment 1. FIG. 6 is a bottom view illustrating a configuration of the lower surface of the reflux semiconductor element 7 according to the embodiment 1.

The reflux semiconductor element 7 includes an element formation part 7A and a bonding part 7B on the upper surface thereof. The reflux semiconductor element 7 includes a bonding part 7D on the lower surface thereof.

The element formation part 7A corresponds to a region where the diode element is formed in a plan view.

The bonding part 7B is provided on the upper surface of the reflux semiconductor element 7. The bonding part 7B is bonded to the wiring frame 8 by the second bonding material 1. The bonding part 7B is provided on the inner side of the element formation part 7A, however, a dimension relationship between the bonding part 7B and the element formation part 7A is not limited thereto. A size of the bonding part 7B may be the same as that of the element formation part 7A. The bonding part 7B is formed of a metal film having fine wettability such as Ni, Au, Cu, or Ag.

The bonding part 7D is provided on the lower surface of the reflux semiconductor element 7. The bonding part 7D according to the embodiment 1 is provided to the whole lower surface of the reflux semiconductor element 7. The bonding part 7D is formed of a metal film having fine wettability such as Ni, Au, Cu, or Ag. The bonding part 7D is bonded to the front side circuit pattern 4 by the first bonding material 2.

The bonding part 7B and the bonding part 7D of the reflux semiconductor element 7 may be formed of the same material as that of the bonding part 6B and the bonding part 6D of the switching semiconductor element 6.

FIG. 7 is a flow chart illustrating a method of manufacturing the semiconductor device 101.

In Step S1, the insulating material 3 including the front side circuit pattern 4 and the back side circuit pattern 5 is prepared.

In Step S2, the switching semiconductor element 6 and the reflux semiconductor element 7 are mounted on the front side circuit pattern 4 via the first bonding material 2. In this Step S2, the first bonding material 2 is firstly disposed between the bonding part 6D of the switching semiconductor element 6 and the front side circuit pattern 4 and between the bonding part 7D of the reflux semiconductor element 7 and the front side circuit pattern 4. Bonding processing is performed on the switching semiconductor element 6, the reflux semiconductor element 7, the first bonding material 2, and the front side circuit pattern 4 under a predetermined atmosphere, temperature and pressure. Accordingly, the bonding parts 6D and 7D are bonded to the front side circuit pattern 4, respectively, by the first bonding material 2.

In Step S3, the switching semiconductor element 6 and the reflux semiconductor element 7 are bonded to the wiring frame 8 via the second bonding material 1. In this Step S3, the second bonding material 1 is firstly disposed between the bonding part 6B of the switching semiconductor element 6 and the wiring frame 8 and between the bonding part 7B of the reflux semiconductor element 7 and the wiring frame 8. Bonding processing is performed on the switching semiconductor element 6, the reflux semiconductor element 7, the second bonding material 1, and the wiring frame 8 under a predetermined atmosphere, temperature and pressure. Accordingly, the bonding parts 6B and 7B are bonded to the wiring frame 8 by the second bonding material 1. Furthermore, in this Step S3, a connection part (not shown) where the wiring frame 8 and the front side circuit pattern 4 are connected may be bonded by the second bonding material 1. The switching semiconductor element 6 and the wiring frame 8 may be bonded by ultrasonic (US) bonding without using the second bonding material 1.

In Step S4, each of five signal pads 6C are connected to the signal terminal 10 by the wire 9.

In Step S5, the sealing material 11 seals the insulating material 3, the front side circuit pattern 4, the first bonding material 2, the switching semiconductor element 6, the reflux semiconductor element 7, the second bonding material 1, a part of the wiring frame 8, the wire 9, and a part of the signal terminal 10.

The semiconductor device 101 is completed by Steps S1 to S5 described above. In Steps S2 and S3, bonding of the bonding parts 6D and 7D to the front side circuit pattern 4 and bonding of the bonding parts 6B and 7B to the wiring frame 8 may be performed at the same time. Productivity is improved by performing the bonding processing at the same time.

FIG. 8 is a cross-sectional view illustrating a configuration of the semiconductor device 101 according to the embodiment 1 after completion. FIG. 8 corresponds to a cross section along a line A-A illustrated in FIG. 1.

The semiconductor device 101 includes a void 2A in the first bonding material 2 of the switching semiconductor element 6. It is assumed in the description hereinafter that the void 2A is located on a lower side of a center part of the switching semiconductor element 6, for example. The void 2A is formed when the switching semiconductor element 6 is bonded on the front side circuit pattern 4 via the first bonding material 2. The formation of the void 2A is caused by outgassing from the bonding part 6B or the front side circuit pattern 4 or an air trap at a time of positioning the switching semiconductor element 6 on the first bonding material 2, for example.

Heat is generated in the switching semiconductor element 6 at a time of driving, that is to say, at a time of power conduction. An amount of increase in temperature by the heat generation is not uniform in the surface of the switching semiconductor element 6. An amount of increase in temperature in the center part of the switching semiconductor element 6 is larger than that in an outer peripheral part thereof. The void 2A also causes increase in temperature. That is to say, when the void 2A is formed in the first bonding material 2, a thermal conductivity of the void 2A is almost zero. Thus, when a position of the void in FIG. 8 is assumed, local increase in temperature occurs in the center part corresponding to a portion immediately above the void 2A. That is to say, an amount of increase in temperature in the center part is doubled.

In the semiconductor device 101 according to the present embodiment, the bonding part 6B is provided in a region immediately above the void 2A, that is to say, a region including the center part. Furthermore, the second bonding material 1 is provided on the bonding part 6B. Thus, even when the void 2A is located on a lower side of the center part of the switching semiconductor element 6, heat generated in the center part is absorbed by the second bonding material 1, and is then diffused. As a result, local increase in temperature of the switching semiconductor element 6 is suppressed.

As an outline of the above description, the semiconductor device 101 according to the embodiment 1 includes the front side circuit pattern 4, the switching semiconductor element 6, the bonding part 6B, and the wiring frame 8. The switching semiconductor element 6 includes the switching element. The switching semiconductor element 6 is held by the front side circuit pattern 4 via the first bonding material 2. The bonding part 6B is provided on the upper surface of the switching semiconductor element 6. The bonding part 6B is electrically connected to the electrode of the switching element other than the gate electrode. The wiring frame 8 is bonded to the bonding part 6B via the second bonding material 1. The bonding part 6B and the second bonding material 1 are provided in a region including the center part of the upper surface of the switching semiconductor element 6.

Such a semiconductor device 101 reduces local increase in temperature caused by the void 2A formed in the first bonding material 2.

An upper limit temperature is set in the switching semiconductor element 6 the reflux semiconductor element 7 to ensure reliability of a lifetime of the semiconductor device 101, for example. The void 2A generates local increase in temperature, thus the void 2A needs to be managed so that the temperature of the switching semiconductor element 6 and the temperature of the reflux semiconductor element 7 do not exceed the preset upper limit temperature. Particularly, a heat generation amount of the switching semiconductor element 6 is larger than that of the reflux semiconductor element 7, thus the management of the void 2A is required more strictly in the switching semiconductor element 6 than the reflux semiconductor element 7. For example, a standard of the void 2A occurring in the switching semiconductor element 6 is more tight than that of the void 2A occurring in the reflux semiconductor element 7. Thus, the switching semiconductor element 6 has a problem of deterioration of productivity due to the void 2A, that is to say, increase in defect rate more easily.

In the semiconductor device 101 according to the present embodiment, the bonding part 6B and the second bonding material 1 are provided in a region immediately above the void 2A. Heat generated in the center part of the switching semiconductor element 6 is transmitted to the second bonding material 1 and the wiring frame 8, and is diffused. As a result, local increase in temperature of the switching semiconductor element 6 is suppressed. The semiconductor device 101 according to the embodiment 1 can achieve extension of a regulated allowable range regarding the void 2A, that is to say, reduction in standard. The semiconductor device 101 can easily manage the void 2A, and increase reliability and productivity.

The void 2A may be formed in any of the switching semiconductor element 6 and the reflux semiconductor element 7. However, the heat generation amount of the switching semiconductor element 6 is larger than that of the reflux semiconductor element 7, thus the above effect significantly appears in a configuration that the void 2A is formed in the first bonding material 2 of the switching semiconductor element 6.

The number of the bonding parts 6B provided on the upper surface of the switching semiconductor element 6 is only one in the semiconductor device 101. According to such a configuration, the second bonding material 1 is easily supplied in the manufacturing process, and productivity is improved.

The gate line is provided not to pass through the center part of the switching semiconductor element 6. According to such a configuration, the bonding part 6B is formed in the center part of the switching semiconductor element 6 where heat is concentrated. Thus, heat radiation properties are improved, and increase in temperature is suppressed.

The switching semiconductor element 6 and the reflux semiconductor element 7 are formed by a wide bandgap semiconductor, thus withstand voltage properties of the switching element or the diode element are improved. An allowable current density is also high, thus the switching element and the diode element can be downsized. Downsizing of the semiconductor device 101 is achieved by using these downsized switching element and diode element.

Modification Example 1 of Embodiment 1

An area of the first bonding material 2 is equal to or larger than 50% of an area of the second bonding material 1. According to such a configuration, balance of the bonding part 6B on a front side of the switching semiconductor element 6 and the bonding part 6D on a back side is improved. As a result, a concave warpage in a front side direction which may occur in the switching semiconductor element 6 is reduced. The reduction of this concave warpage prevents the void 2A occurring in the first bonding material 2 from being concentrated on the center part of the switching semiconductor element 6.

Modification Example 2 of Embodiment 1

A horizontal-vertical ratio of the switching semiconductor element 6 in a plan view is equal to or larger than 1.5 and equal to or smaller than 2.5. According to such a configuration, the void 2A in the center part of the switching semiconductor element 6 is easily emitted to an outer portion from a long side of the switching semiconductor element 6.

In addition to the horizontal-vertical ratio described above, an area of the switching semiconductor element 6 is equal to or smaller than 150 mm². In such a configuration, a distance from the center part of the switching semiconductor element 6 to the long side thereof is small. The void 2A occurring in the center part is emitted to the outer portion from the long side more easily. In the meanwhile, in addition to the horizontal-vertical ratio described above, the area of the switching semiconductor element 6 may be equal to or larger than 150 mm². In the size described above, the plurality of gate lines need to be disposed to uniformized a voltage application of the gate, however, influence of the void can be reduced by applying the horizontal-vertical ratio described above in addition to the configuration of the present embodiment.

Modification Example 3 of Embodiment 1

The thickness of the switching semiconductor element 6 is equal to or smaller than 150 μm. In such a configuration, bending rigidity of the switching semiconductor element 6 is reduced, thus warpage easily occurs. Even when the void 2A occurs in the center part by the warpage, the bonding part 6B and the second bonding material 1 are provided immediately above the void 2A, thus local increase in temperature hardly occurs.

Modification Example 4 of Embodiment 1

The switching semiconductor element 6 and the reflux semiconductor element 7 according to the embodiment 1 are elements different from each other, but may be integrated elements formed in the same semiconductor substrate. For example, the switching semiconductor element 6 includes a reverse-conducting IGBT (RC-IGBT) in which an IGBT and a diode element are formed in one semiconductor substrate as a switching element. When the switching element is the RC-IGBT, the number of elements decreases, and productivity is improved.

Embodiment 2

FIG. 9 is a plan view illustrating a configuration of a semiconductor device 102 according to an embodiment 2. FIG. 10 is a cross-sectional view illustrating a configuration of the semiconductor device 102 according to the embodiment 2. FIG. 10 corresponds to a cross section along a line B-B illustrated in FIG. 9.

The semiconductor device 102 includes a switching semiconductor element 16 in place of the switching semiconductor element 6 described in the embodiment 1.

FIG. 11 is a plan view illustrating a configuration of an upper surface of the switching semiconductor element 16 according to the embodiment 2.

The switching semiconductor element 16 includes a first element formation part 16A, two second element formation parts 26A, a first bonding part 16B, two second bonding parts 26B, five signal pads 16C, and a plurality of gate lines (not shown) on the upper surface of the switching semiconductor element 16. The first element formation part 16A and two second element formation parts 26A correspond to a configuration that the element formation part 6A according to the embodiment 1 is divided into three regions. In the similar manner, the first bonding part 16B and two second bonding parts 26B correspond to a configuration that the bonding part 6B according to the embodiment 1 is divided into three regions. A configuration of a lower surface of the switching semiconductor element 16 is similar to that of the switching semiconductor element 6 according to the embodiment 1.

The first element formation part 16A and two second element formation parts 26A correspond to a region where the switching element is formed in a plan view. The first element formation part 16A includes a center part (not shown) of the upper surface of the switching semiconductor element 16. Two second element formation parts 26A are disposed on both sides of the first element formation part 16A.

The first bonding part 16B is provided in a region including the center part of the switching semiconductor element 16. The first bonding part 16B is preferably disposed so that a center of the first bonding part 16B is overlapped with the center part of the switching semiconductor element 16. Two second bonding parts 26B are provided in a region other than the first bonding part 16B. Herein, two second bonding parts 26B are provided on both sides of the first bonding part 16B.

The first bonding part 16B and the second bonding part 26B are bonded to the wiring frame 8 by the second bonding material 1. The second bonding material 1 is also provided in a region including the center part in a plan view.

The configuration of the signal pad 16C is similar to that of the signal pad 6C according to the embodiment 1.

The plurality of gate lines are provided to pass across the upper surface of the switching semiconductor element 16. Each gate line is provided not to pass through the center part of the switching semiconductor element 16. Each gate line is disposed in a region other than the first bonding part 16B.

It is considered to increase an area of the switching semiconductor element 16 as measures to improve a current capacity. However, balance of applying gate voltage in the surface of the switching semiconductor element 16 is deteriorated in accordance with increase in area thereof, and short-circuit resistance decreases. When the gate line is disposed to pass across the center part, the balance of applying the gate voltage can be improved, however, the bonding part 6B and the second bonding material 1 cannot be disposed in the center part. Thus, when the void 2A is formed in the center part, local increase in temperature occurs in the center part.

In the semiconductor device 102, the gate line is not provided in the center part of the switching semiconductor element 16, however, the plurality of gate lines are disposed in a region other than the center part, thus the balance of applying the gate voltage is improved. The first bonding part 16B and the first bonding material 2 are provided in the center part of the switching semiconductor element 16. Thus, even when the area of the switching semiconductor element 16 is increased, the semiconductor device 102 prevents deterioration of the balance of applying the gate voltage, and suppresses increase in temperature caused by the void 2A formed on the lower side of the center part.

The number of divided bonding parts 6B is not limited to three. The bonding part 6B is preferably divided by an odd number equal or larger than three as necessary. In other words, the semiconductor device 102 preferably includes the first bonding part 16B provided in the center part and the even number of second bonding parts 26B provided around the first bonding part 16B.

Modification Example 1 of Embodiment 2

A horizontal-vertical ratio of the switching semiconductor element 16 in a plan view is equal to or larger than 1.5 and equal to or smaller than 2.5. According to such a configuration, the void 2A in the center part is easily emitted to an outer portion from a long side of the switching semiconductor element 16.

The area of the switching semiconductor element 16 is equal to or larger than 150 mm². The current capacity increases by increasing the area of the switching semiconductor element 16. The first bonding part 16B and the second bonding material 1 are disposed in the center part, thus increase in temperature caused by the void 2A is reduced. Furthermore, the plurality of gate lines are disposed, thus uniformity of the gate voltage is improved.

Embodiment 3

FIG. 12 is a plan view illustrating a configuration of a semiconductor device 103 according to an embodiment 3.

The semiconductor device 103 includes a switching semiconductor element 26 and a switching semiconductor element 36. The switching semiconductor element 26 and the switching semiconductor element 36 have the same configuration as each other. The switching semiconductor element 26 and the switching semiconductor element 36 are connected in parallel to each other. The number of switching semiconductor elements connected in parallel to each other is not limited to two. Three or more switching semiconductor elements may be connected in parallel to each other as necessary.

The emitter signal (E), the current sense signal (Cs), and the temperature sense signal (K, A) are taken out from only the switching semiconductor element 26. The gate signal (G) is taken out from both elements of the switching semiconductor element 26 and the switching semiconductor element 36. The emitter signal (E), the current sense signal (Cs), and the temperature sense signal (K, A) may be taken out from the switching semiconductor element 26 and the switching semiconductor element 36 to improve a protection function.

The plurality of small elements are used in place of one large element, thus the current capacity can be increased while the balance of applying the gate voltage is improved.

The void 2A hardly occurs in the second bonding material 1. The bonding part 6B is simplified, thus the occurrence of the void 2A further decreases, and a defect rate is reduced.

Embodiment 4

FIG. 13 is a plan view illustrating a configuration of a semiconductor device 104 according to an embodiment 4. FIG. 14 is a cross-sectional view illustrating a configuration of a semiconductor device 104 according to the embodiment 4. FIG. 14 corresponds to a cross section along a line C-C illustrated in FIG. 13.

The wiring frame 8 includes a through hole 8A in a bonding surface where the wiring frame 8 is bonded to the bonding part 6B. The through hole 8A is provided not to be overlapped with the center part of the switching semiconductor element 6 in a plan view.

In a process of bonding the wiring frame 8 and the bonding part 6B, when an amount of the second bonding material 1 supplied between the wiring frame 8 and the bonding part 6B is excessive, there is a possibility that the redundant second bonding material 1 flows outside the bonding part 6B. The through hole 8A leads the excessive second bonding material 1 located between the wiring frame 8 and the bonding part 6B into the thorough hole 8A, thereby preventing the second bonding material 1 from flowing outside the bonding part 6B.

However, when a bonding material having high flowability such as a solder is adopted to the second bonding material 1, a shape of the second bonding material 1 immediately below the through hole 8A is not stable. For example, when a supply amount of the solder is small, a thickness of the second bonding material 1 is smaller immediately below the through hole 8A than that around the through hole 8A by influence of surface tension. In such a case, an effect of reducing increase in temperature caused by the void 2A is small immediately below the through hole 8A.

In the semiconductor device 104, the through hole 8A is provided not to be overlapped with the center part of the switching semiconductor element 6. Thus, the thickness of the second bonding material 1 is ensured also in the center part of the switching semiconductor element 6. The second bonding material 1 suppresses increase in temperature caused by the void 2A occurring in the center part of the switching semiconductor element 6.

Embodiment 5

FIG. 15 is a plan view illustrating a configuration of a semiconductor device 105 according to an embodiment 5.

The semiconductor device 105 includes a switching semiconductor element 46 in place of the switching semiconductor element 6 described in the embodiment 1.

FIG. 16 is a plan view illustrating a configuration of an upper surface of the switching semiconductor element 46 according to the embodiment 5.

The switching semiconductor element 46 includes an element formation part 46A, a bonding part 46B, four signal pads 46C, and a plurality of gate lines (not shown) on the upper surface of the switching semiconductor element 46.

The element formation part 46A corresponds to a region where the switching element is formed in a plan view. A part of the element formation part 46A is provided side by side with four signal pads 46C on one side of the switching semiconductor element 46 in a plan view.

The bonding part 46B is similar to the bonding part 6B according to the embodiment 1.

Four signal pads 46C are provided to a region in the upper surface of the switching semiconductor element 46 other than the element formation part 46A. Four signal pads 46C are provided along one side of the switching semiconductor element 46 in a plan view. Each signal pad 46C is a pad for transmitting or receiving a signal for controlling or protecting the switching element. The signal is the gate signal (G), the current sense signal (Cs), and the temperature sense signal (K, A).

The element formation part 46A extends from a center part between two signal pads adjacent to each other in four signals pads 46C. The signal pad 46C and the element formation part 46A are disposed side by side on one side.

The element formation part 46A functions as a signal pad for the emitter signal (E) on a side of one side of the switching semiconductor element 46. Accordingly, the wire 9 connects the signal terminal 10 and the element formation part 46A on the side of one side of the switching semiconductor element 46.

An area of the element formation part 46A is larger than the element formation part 6A described in the embodiment 1. Thus, even when the switching semiconductor element 6 and the switching semiconductor element 46 have the same area, loss of the semiconductor device 105 is improved more than loss of the semiconductor device 101 according to the embodiment 1. The semiconductor device 105 having high efficiency is achieved.

In the present disclosure, each embodiment can be arbitrarily combined, or each embodiment can be appropriately varied or omitted.

The aspects of the present disclosure are collectively described hereinafter as an Appendix.

(Appendix 1)

A semiconductor device, comprising:

a conductive member;

a semiconductor element including a switching element and held by the conductive member via a first bonding material;

at least one bonding part provided on an upper surface of the semiconductor element and electrically connected to an electrode of the switching element other than a gate electrode; and a lead bonded to the bonding part via a second bonding material, wherein the bonding part and the second bonding material are provided in a region including a center part of the upper surface of the semiconductor element.

(Appendix 2)

The semiconductor device according to the appendix 1, further comprising a sealing material sealing the conductive member, the first bonding material, the semiconductor element, the bonding part, the second bonding material, and a part of the lead.

(Appendix 3)

The semiconductor device according to the appendix 1 or 2, wherein a total number of the bonding parts provided on the upper surface of the semiconductor element is only one.

(Appendix 4)

The semiconductor device according to any one of the appendixes 1 to 3, further comprising a plurality of gate lines provided to pass across the upper surface of the semiconductor element and electrically connected to the gate electrode of the switching element, wherein the plurality of gate lines are provided not to pass through the center part.

(Appendix 5)

The semiconductor device according to any one of the appendixes 1 to 3, further comprising a plurality of gate lines provided to pass across the upper surface of the semiconductor element and electrically connected to the gate electrode of the switching element, wherein the bonding part includes a first bonding part provided to the region including the center part and a plurality of second bonding parts provided to a region other than the first bonding part, and the plurality of gate lines are provided not to pass through the center part.

(Appendix 6)

The semiconductor device according to any one of the appendixes 1 to 5, wherein an area of the first bonding material is equal to or larger than 50% of an area of the second bonding material.

(Appendix 7)

The semiconductor device according to any one of the appendixes 1 to 6, wherein a horizontal-vertical ratio of the semiconductor element in a plan view is equal to or larger than 1.5 and equal to or smaller than 2.5, and an area of the semiconductor element is equal to or smaller than 150 mm².

(Appendix 8)

The semiconductor device according to any one of the appendixes 1 to 6, wherein a horizontal-vertical ratio of the semiconductor element in a plan view is equal to or larger than 1.5 and equal to or smaller than 2.5, and an area of the semiconductor element is equal to or larger than 150 mm².

(Appendix 9)

The semiconductor device according to any one of the appendixes 1 to 8, wherein a thickness of the semiconductor element is equal to or smaller than 150 μm.

(Appendix 10)

The semiconductor device according to any one of the appendixes 1 to 9, wherein the semiconductor element includes:

an element formation part corresponding to a region where the switching element is formed in a plan view; and a plurality of signal pads provided in a region in the upper surface of the semiconductor element other than the element formation part for transmitting or receiving a signal for controlling or protecting the switching element, the plurality of signal pads are provided along one side of the semiconductor element in a plan view, and a part of the element formation part is provided side by side with the plurality of signal pads on the one side of the semiconductor element in a plan view.

(Appendix 11)

The semiconductor device according to any one of the appendixes 1 to 10, wherein the lead includes a through hole in a bonding surface where the lead is bonded to the bonding part, and the through hole is provided not to be overlapped with the center part in a plan view.

(Appendix 12)

The semiconductor device according to any one of the appendixes 1 to 11, wherein the semiconductor element includes an RC-IGBT as the switching element.

(Appendix 13)

The semiconductor device according to any one of the appendixes 1 to 12, wherein the semiconductor element is made up of a wide bandgap semiconductor.

(Appendix 14)

The semiconductor device according to the appendix 13, wherein the wide bandgap semiconductor includes a silicon carbide, a gallium nitride series material, or diamond.

(Appendix 15)

The semiconductor device according to any one of the appendixes 1 to 14, wherein the first bonding material includes a void, and the void is located on a lower side of the center part.

(Appendix 16)

A semiconductor device, comprising:

a conductive member;

a plurality of semiconductor elements each including a switching element and held by the conductive member via a first bonding material;

a bonding part provided on an upper surface of each of the plurality of semiconductor elements and electrically connected to an electrode of the switching element other than a gate electrode; and a lead bonded to the bonding part via a second bonding material, wherein the plurality of semiconductor elements are connected in parallel to each other, and the bonding part and the second bonding material are provided in a region including a center part of the upper surface of each of the plurality of semiconductor elements.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a conductive member;

a semiconductor element including a switching element and held by the conductive member via a first bonding material;

at least one bonding part provided on an upper surface of the semiconductor element and electrically connected to an electrode of the switching element other than a gate electrode; and a lead bonded to the bonding part via a second bonding material, wherein the bonding part and the second bonding material are provided in a region including a center part of the upper surface of the semiconductor element, a horizontal-vertical ratio of the semiconductor element in a plan view is equal to or larger than 1.5 and equal to or smaller than 2.5, and an area of the semiconductor element is equal to or smaller than 150 mm², the lead includes a through hole in a bonding surface where the lead is bonded to the bonding part, and the through hole is provided not to be overlapped with the center part in a plan view.

2. The semiconductor device according to claim 1, further comprising:

a sealing material sealing the conductive member, the first bonding material, the semiconductor element, the bonding part, the second bonding material, and a part of the lead.

3. The semiconductor device according to claim 1, wherein a total number of the bonding parts provided on the upper surface of the semiconductor element is only one.

4. The semiconductor device according to claim 1, further comprising a plurality of gate lines provided to pass across the upper surface of the semiconductor element and electrically connected to the gate electrode of the switching element, wherein the plurality of gate lines are provided not to pass through the center part.

5. The semiconductor device according to claim 1, further comprising a plurality of gate lines provided to pass across the upper surface of the semiconductor element and electrically connected to the gate electrode of the switching element, wherein the bonding part includes a first bonding part provided to the region including the center part and a plurality of second bonding parts provided to a region other than the first bonding part, and the plurality of gate lines are provided not to pass through the center part.

6. The semiconductor device according to claim 1, wherein an area of the first bonding material is equal to or larger than 50% of an area of the second bonding material.

7. The semiconductor device according to claim 1, wherein a thickness of the semiconductor element is equal to or smaller than 150 μm.

8. The semiconductor device according to claim 1, wherein the semiconductor element includes:

an element formation part corresponding to a region where the switching element is formed in a plan view; and a plurality of signal pads provided in a region in the upper surface of the semiconductor element other than the element formation part for transmitting or receiving a signal for controlling or protecting the switching element, the plurality of signal pads are provided along one side of the semiconductor element in a plan view, and a part of the element formation part is provided side by side with the plurality of signal pads on the one side of the semiconductor element in a plan view.

9. The semiconductor device according to claim 1, wherein the semiconductor element includes an RC-IGBT as the switching element.

10. The semiconductor device according to claim 1, wherein the semiconductor element is made up of a wide bandgap semiconductor.

11. The semiconductor device according to claim 10, wherein the wide bandgap semiconductor includes a silicon carbide, a gallium nitride series material, or diamond.

12. The semiconductor device according to claim 1, wherein the first bonding material includes a void, and the void is located on a lower side of the center part.

13. A semiconductor device, comprising:

a conductive member;

a plurality of semiconductor elements each including a switching element and held by the conductive member via a first bonding material;

a bonding part provided on an upper surface of each of the plurality of semiconductor elements and electrically connected to an electrode of the switching element other than a gate electrode; and a lead bonded to the bonding part via a second bonding material, wherein the plurality of semiconductor elements are connected in parallel to each other, the bonding part and the second bonding material are provided in a region including a center part of the upper surface of each of the plurality of semiconductor elements, a horizontal-vertical ratio of the semiconductor element in a plan view is equal to or larger than 1.5 and equal to or smaller than 2.5, and an area of the semiconductor element is equal to or smaller than 150 mm$^2$, the lead includes a through hole in a bonding surface where the lead is bonded to the bonding part, and the through hole is provided not to be overlapped with the center part in a plan view.

14. A semiconductor device, comprising: a conductive member; a semiconductor element including a switching element and held by the conductive member via a first bonding material; at least one bonding part provided on an upper surface of the semiconductor element and electrically connected to an electrode of the switching element other than a gate electrode; and a lead bonded to the bonding part via a second bonding material, wherein the bonding part and the second bonding material are provided in a region including a center part of the upper surface of the semiconductor element, and a horizontal-vertical ratio of the semiconductor element in a plan view is equal to or larger than 1.5 and equal to or smaller than 2.5, and an area of the semiconductor element is equal to or smaller than 150 mm$^2$, the first bonding material includes a void, and the void is located on a lower side of the center part.

15. A semiconductor device, comprising: a conductive member; a plurality of semiconductor elements each including a switching element and held by the conductive member via a first bonding material; a bonding part provided on an upper surface of each of the plurality of semiconductor elements and electrically connected to an electrode of the switching element other than a gate electrode; and a lead bonded to the bonding part via a second bonding material, wherein the plurality of semiconductor elements are connected in parallel to each other, the bonding part and the second bonding material are provided in a region including a center part of the upper surface of each of the plurality of semiconductor elements, and a horizontal-vertical ratio of the semiconductor element in a plan view is equal to or larger than 1.5and equal to or smaller than 2.5, and an area of the semiconductor element is equal to or smaller than 150 mm$^2$, the first bonding material includes a void, and the void is located on a lower side of the center part.

* * * * *